United States Patent
Vicard et al.

(10) Patent No.: US 9,888,573 B2
(45) Date of Patent: Feb. 6, 2018

(54) CAP FOR A CHIP DEVICE HAVING A GROOVE, DEVICE PROVIDED WITH SAID CAP, ASSEMBLY CONSISTING OF THE DEVICE AND A WIRE ELEMENT, AND MANUFACTURING METHOD THEREOF

(71) Applicant: COMMISSARIAT A L'ENERGIE ATOMIQUE ET AUX ENERGIES ALTERNATIVES, Paris (FR)

(72) Inventors: Dominique Vicard, Bernin (FR); Jean Brun, Champagnier (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 232 days.

(21) Appl. No.: 14/428,454

(22) PCT Filed: Sep. 13, 2013

(86) PCT No.: PCT/EP2013/068972
§ 371 (c)(1),
(2) Date: Mar. 16, 2015

(87) PCT Pub. No.: WO2014/041107
PCT Pub. Date: Mar. 20, 2014

(65) Prior Publication Data
US 2015/0230336 A1 Aug. 13, 2015

(30) Foreign Application Priority Data
Sep. 17, 2012 (FR) .................................. 12 58687

(51) Int. Cl.
*H05K 1/18* (2006.01)
*H05K 3/46* (2006.01)
(Continued)

(52) U.S. Cl.
CPC ................ *H05K 1/11* (2013.01); *H01L 23/10* (2013.01); *H01L 23/3157* (2013.01);
(Continued)

(58) Field of Classification Search
CPC .......... H05K 2/11; H05K 1/181; H05K 1/182; H05K 3/0091; H05K 3/46;
(Continued)

(56) References Cited

U.S. PATENT DOCUMENTS 6,351,028 B1   2/2002   Akram
7,155,816 B2   1/2007   Ninomiya et al.
(Continued)

FOREIGN PATENT DOCUMENTS

CN   1625806 A     6/2005
CN   102110677 A   6/2011
(Continued)

OTHER PUBLICATIONS

International Search Report dated Nov. 8, 2013 issued in corresponding application No. PCT/EP2013/068972, and written opinion; with partial English translation and machine-translation.
(Continued)

*Primary Examiner* — Eric Thomas
*Assistant Examiner* — Michael P McFadden
(74) *Attorney, Agent, or Firm* — Westerman, Hattori, Daniels & Adrian, LLP (57) ABSTRACT

The cap (1) is intended to be assembled with at least one chipped element (2), said cap comprising a stack of a plurality of electrically insulating layers (1a) delimiting at least one shoulder (3) forming a part of a first groove (4) for housing a wired element (12). The cap further comprises: at least one electrical bump contact (6) arranged at an assembly surface (7) of the stack intended to be mounted on a face of the chipped element (2); at least one electrical connection
(Continued)

terminal (5, 5') arranged at a wall of the shoulder (3); an electrical link element (8), electrically linking said electrical connection terminal (5) to the electrical bump contact (6).

22 Claims, 5 Drawing Sheets (51) Int. Cl.
*H01L 23/10* (2006.01)
*H01L 23/31* (2006.01)
*H05K 1/11* (2006.01)
*H01L 23/00* (2006.01)
*H05K 3/00* (2006.01)

(52) U.S. Cl.
CPC .............. *H01L 24/69* (2013.01); *H05K 1/181* (2013.01); *H05K 1/182* (2013.01); *H05K 3/0091* (2013.01); *H05K 3/46* (2013.01); *H01L 24/66* (2013.01); *H01L 2224/66* (2013.01); *H01L 2224/69* (2013.01); *H01L 2224/72* (2013.01); *H01L 2924/00014* (2013.01); *H01L 2924/12041* (2013.01); *H05K 2201/09036* (2013.01)

(58) Field of Classification Search
CPC .......... H05K 2201/09086; H01L 23/10; H01L 23/3157; H01L 24/69; H01L 24/66; H01L 2224/66; H01L 2224/69; H01L 2224/72; H01L 2924/00014; H01L 2924/12041
USPC ........................................................ 361/760
See application file for complete search history.

(56) References Cited

U.S. PATENT DOCUMENTS

| 8,258,044 | B2 | 9/2012 | Brun et al. |
| 8,445,328 | B2 | 5/2013 | Brun et al. |
| 8,592,959 | B2 | 11/2013 | Fujii |
| 8,611,101 | B2 | 12/2013 | Brun et al. |
| 8,654,540 | B2 | 2/2014 | Brun et al. |
| 8,723,312 | B2 | 5/2014 | Brun et al. |
| 2004/0089472 | A1 | 5/2004 | Ninomiya et al. |
| 2009/0227069 | A1 | 9/2009 | Brun et al. |
| 2011/0013400 | A1* | 1/2011 | Kanno .................... F21V 23/06 362/296.01 |
| 2011/0127655 | A1 | 6/2011 | Fujii |
| 2011/0149540 | A1 | 6/2011 | Brun et al. |
| 2011/0198735 | A1 | 8/2011 | Brun et al. |
| 2011/0287606 | A1 | 11/2011 | Brun et al. |
| 2012/0064671 | A1 | 3/2012 | Brun et al. |
| 2012/0153771 | A1* | 6/2012 | Formosa ............... B81C 1/0023 310/300 |

FOREIGN PATENT DOCUMENTS

| EP | 1471573 A1 | 10/2004 |
| EP | 2 099 060 A1 | 9/2009 |
| FR | 2 937 464 A1 | 4/2010 |
| FR | 2 960 339 A1 | 11/2011 |
| FR | 2 964 786 A1 | 3/2012 |
| JP | 2007-43213 A | 2/2007 |
| JP | 2007-157949 A | 6/2007 |
| JP | 2008-10885 A | 1/2008 |

OTHER PUBLICATIONS

Chinese search report and office action dated Feb. 4, 2017 in co-pending Chinese application No. 201380058912.8; with English partial translation and partial machine translation (18 pages) (FR2937464, FR2960339, and FR2964786 cited in the Chinese search report are not listed in this IDS form since they were already listed in the IDS filed on Mar. 16, 2015).

Japanese office action dated Aug. 22, 2017 in counterpart Japanese application No. 2015-531563; with English translation (6 pages).

* cited by examiner

CAP FOR A CHIP DEVICE HAVING A GROOVE, DEVICE PROVIDED WITH SAID CAP, ASSEMBLY CONSISTING OF THE DEVICE AND A WIRE ELEMENT, AND MANUFACTURING METHOD THEREOF

TECHNICAL FIELD OF THE INVENTION

The invention relates to the field of microelectronics.

More particularly, the subject of the invention is a cap intended to be assembled with at least one chipped element.

STATE OF THE ART

In the field of electronic chips, notably to be integrated with a wired element, there are devices equipped with a chipped element on which a cap is mounted so as to delimit a groove for embedding the wired element. The chipped element comprises a connection terminal arranged on a part of the chipped element which also delimits a part of the groove. This terminal makes it possible to electrically connect the wired element embedded in the groove to the chip of the chipped element.

In order to produce a correct embedding of the wired element and ensure a good electrical contact between the wired element and the connection terminal, it is preferably for the dimensions of the groove to be precise and easily reproducible from one device to another.

Such a cap can be produced as described in the document FR2960339 of the applicant, by implementing an injection step making it possible to mould a cap. This entails manufacturing the caps directly on the chipped elements through the hardening of a material.

SUBJECT OF THE INVENTION

The aim of the present invention is to propose an alternative solution to that of the prior art, notably proposing an independent manufacturing of the caps.

This aim is achieved in that the cap is intended to be assembled with at least one chipped element, and in that said cap comprises a stack of a plurality of electrically insulating layers delimiting at least one shoulder forming a part of a first groove for housing a wired element. Furthermore, the cap comprises: at least one electrical bump contact arranged at an assembly surface of the stack intended to be mounted on a face of the chipped element; at least one electrical connection terminal arranged at a wall of the shoulder; an electrical link element electrically linking said electrical connection terminal to the electrical bump contact.

The wall of the shoulder associated with the electrical connection terminal can be included in a plane that is offset relative to the plane including the assembly surface.

According to one implementation of the electrical link element, the latter can comprise at least one first electrically conductive element inserted between two electrically insulating layers of the stack. Furthermore, the electrical link element can comprise at least one second electrically conductive element separated from the first electrically conductive element by at least one of the electrically insulating layers of the stack. Moreover, said at least one electrically insulating layer separating the first and second electrically conductive elements can comprise a hole that is passed through by a third electrically conductive element of the electrical link element, said third electrically conductive element electrically linking the first electrically conductive element to the second electrically conductive element.

According to one embodiment, the stack comprises a printed circuit of which at least one printed track, notably between two superposed electrically insulating layers, forms at least a part of the electrical link element.

According to a particular example, the shoulder cooperates with another shoulder of said cap so as to delimit the first groove.

The cap can comprise at least one second groove, dissociated from the shoulder of the first groove, the walls of which are formed wholly or partly by faces of the cap.

According to one embodiment, the cap comprises at least one additional electrical connection terminal formed at one of the walls of the second groove. Moreover, the electrical link element can electrically link the additional electrical connection terminal to said electrical bump contact, and/or the additional electrical connection terminal can be electrically linked to an additional electrical bump contact, positioned at the surface intended to be mounted on the face of the chipped element, by an additional electrical link element.

The invention also relates to a device comprising a chipped element provided with at least one electronic chip, a cap as described assembled with the chipped element, at least one groove intended to receive a wired element and delimited at least partly by the shoulder of the cap, and at least one electrical connection terminal positioned in the groove and electrically linked to said chip of the chipped element.

Advantageously, the chipped element comprises at least one electrical connection member of the chip electrically linked to an associated electrical bump contact of the cap so as to electrically link the chip to the electrical connection terminal positioned at the shoulder of the cap.

According to one implementation, the groove comprises two opposite lateral walls facing one another, one of the lateral walls being formed by a part of the chipped element and the other lateral wall by a part of the shoulder of the cap, the electrical connection terminal being positioned at the lateral wall associated with the cap.

The invention also relates to an assembly comprising a device as described and an at least partially electrically conductive wired element mounted in the groove, said wired element being in electrical contact with the electrical connection terminal.

The invention also relates to a manufacturing method comprising a step of producing at least one cap as described.

According to one implementation of the method, the step of producing the cap comprises:

a step of forming a first part of a stack of electrically insulating layers, a step of forming a second part of the stack of electrically insulating layers configured so as to delimit, with the first part of the stack of layers, the shoulder intended to at least partly delimit the first groove.

Moreover, the step of producing the cap can comprise a step of producing an electrical connection terminal at the shoulder, an electrical bump contact at the second part of the stack of layers, and an electrical link element running through the second part of the stack of layers, or through the first part and the second part of the stack of electrically insulating layers.

According to another implementation of the method, the production step making it possible to produce a plurality of caps, it comprises:

a step of forming a first set of superposed electrically insulating layers, a step of forming a plurality of second sets of superposed electrically insulating layers substantially parallel to one another and each extending from a same face of the first set of layers, the second sets of adjacent layers being separated by a separation portion of the face of the first set of layers bearing them.

The method can comprise a step of individualization of the caps. This step of individualization of the caps can comprise:
- a first step of cutting the first set of layers at each separation portion along a first corresponding cutting line,
- a second step of cutting the first set of layers and the second set of layers along at least one second cutting line secant to the first cutting line.

Preferably, before the step of individualization of the caps, the method comprises a step of mounting a substrate comprising a plurality of chipped elements so as to associate the chipped elements with the future caps.

The first and second cutting steps can be configured so as to also separate the different chipped elements from one another after the step of mounting the substrate.

Advantageously, the step of forming the plurality of caps comprises, for each future cap, the following steps:
- producing at least one electrical connection terminal at the first set of layers or at the corresponding second set of layers,
- producing at least one electrical bump contact at the first set or the corresponding second set of layers,
- producing at least one electrical link element running through the first set of layers and/or through the corresponding second set of layers, and electrically linking said electrical connection terminal and said electrical bump contact.

BRIEF DESCRIPTION OF THE DRAWINGS

Other advantages and features will emerge more clearly from the following description of particular embodiments of the invention given as nonlimiting examples and represented in the attached drawings, in which.

DESCRIPTION OF PREFERRED EMBODIMENTS OF THE INVENTION

The cap described below differs from the prior art notably in that it is manufactured based on a stacking of electrically insulating layers. The layers stacking are technologies that are well mastered and that make it possible, among other things, to ensure reproducible manufacture and therefore a reproducible and precise separation between the walls of a groove.

Figure 1:
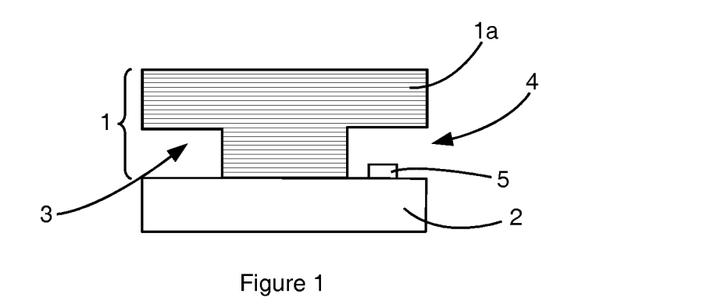
FIG. 1 is a side view of a cap, according to one embodiment, assembled with a chipped element.
Figure 2:
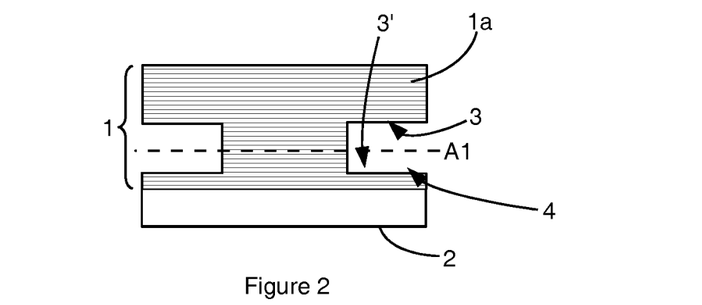
FIG. 2 is a view representing a variant embodiment of the cap assembled with a chipped element of FIG. 1.

As illustrated in FIGS. 1 and 2, the cap 1, intended to be assembled with at least one chipped element 2 (in FIGS. 1 and 2, the cap 1 is shown assembled with a corresponding chipped element 2), comprises a stack of a plurality of electrically insulating layers 1a (preferably at least three electrically insulating layers) delimiting at least one shoulder 3 forming a part of a first groove 4 for housing a wired element (not represented).

Preferably, the cap can form an at least partial protection for a chipped element. Furthermore, preferably, the cap does not include any electronic function except, where necessary, a simple electrical routing.

The electrically insulating layers of the stack can be produced in one and the same material and advantageously have the same thickness.

The stack is, preferably, produced in such a way that, once assembled with a chipped element, the stacked layers rise from the chipped element moving away, little by little, from the chipped element.

In FIG. 1, the shoulder 3 co-operates with the chipped element 2 to delimit a groove 4. Advantageously, the cap 1 has a "T" section delimiting two opposite shoulders intended to form, when the associated cap 1 is assembled with a corresponding chipped element 2, two opposite grooves.

In FIG. 2, the shoulder 3 co-operates with another shoulder 3' of said cap 1 so as to delimit the first groove 4. These two shoulders 3, 3' are positioned opposite one another relative to an axis A1, parallel to the surface of contact or of assembly of the stack and of the chipped element 2, and face one another. Advantageously, the cap 1 illustrated has an "H" section delimiting two opposite grooves.

Figure 3:
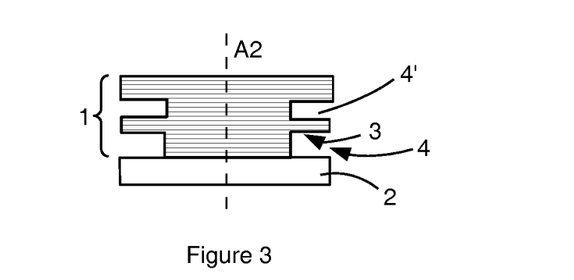
FIG. 3 is a view representing another variant embodiment of the cap assembled with a chipped element.
Figure 17:
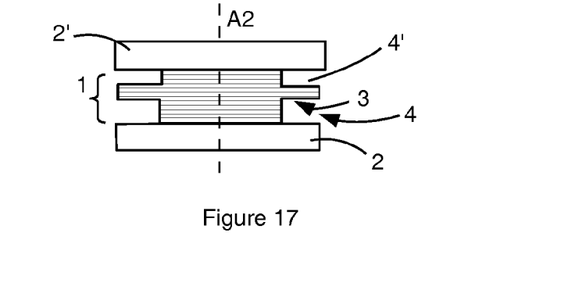
FIG. 17 is a view representing a variant embodiment of a cap assembled with two chipped elements.

According to a variant illustrated in FIG. 3, notably applicable to the two embodiments of FIGS. 1 and 2, the cap 1 comprises at least one second groove 4' dissociated from the shoulder 3 of the first groove 4, the walls of which are formed wholly or partly by faces of said cap 1. Preferably, the walls of the second groove 4' are formed only by the cap 1 (FIG. 3) or else partly by the cap 1 and by a surface of another chipped element 2' as illustrated in FIG. 17 which uses all the references in common with FIG. 3. In FIG. 17, the cap is sandwiched between two chipped elements. In other words, along an axis A2, in the example represented at right angles to the surface of contact or of assembly of the stack and of the chipped element 2, it is possible to stage, at suitable intervals, a plurality of grooves for housing a wired element. This axis A2 is substantially at right angles to the plane including the chipped element 2. Advantageously, the cap can comprise a plurality of planes each associated with two grooves and offset from one another along the axis A2, said planes being substantially at right angles to this axis A2 so as to move away, one by one, from the chipped element 2.

The stacking of the electrically insulating layers can be produced by using techniques derived from the PCB (printed circuit board) technology.

In FIG. 1, the chipped element comprises, in the groove 4, a connection terminal 5 intended to connect a wired element to a chip of the chipped element 2.

In addition to the particular advantage of producing such caps reproducibly, the use of electrically insulating layers advantageously makes it possible to separate, at the cap 1, the electrical connection terminal 5 from the wired element mounted in the groove usually at the chipped element 2.

Figure 4:
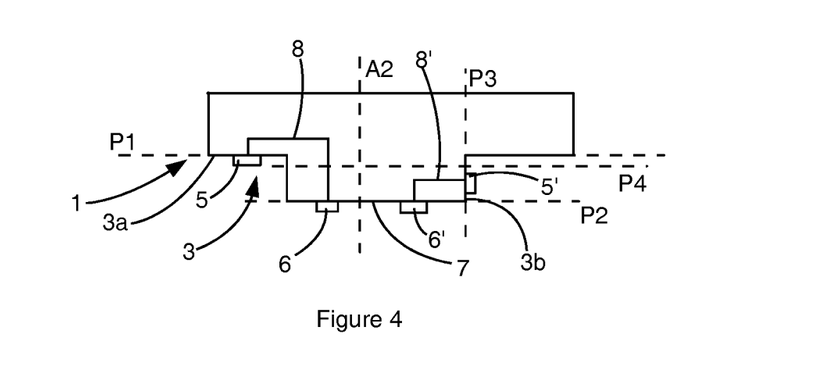
FIG. 4 illustrates a particular embodiment of a cap in more detail.

In other words, as illustrated in FIG. 4, the cap 1 can comprise at least one electrical bump contact 6, 6' arranged at a surface of assembly 7 of the stack intended to be mounted on a face of the chipped element 2, and at least one electrical connection terminal 5, 5' arranged at a wall 3a, 3b of the shoulder 3 of the cap 1. Obviously, the cap 1 also comprises an electrical link element 8, 8' linking said electrical connection terminal 5, 5' to the electrical bump contact 6, 6'. Advantageously, producing the electrical links in the cap notably allows for a better protection thereof.

Generally, a shoulder as described in the present description can comprise, as illustrated by FIG. 4, two walls 3a, 3b arranged suitably with the rest of the cap to make it possible to form a housing, preferably elongate, for receiving a wired element. This housing is completed by the mounting of the chipped element 2 with the cap 1 so as to delimit a groove of which a bottom and a lateral wall, extending from the bottom, are formed by said shoulder, the other lateral wall of the groove then being formed by a part of said chipped element 2. In other words, the two walls 3a, 3b are secant and have a link interface with one another from which said walls 3a, 3b extend forming a flared configuration.

Figure 8:
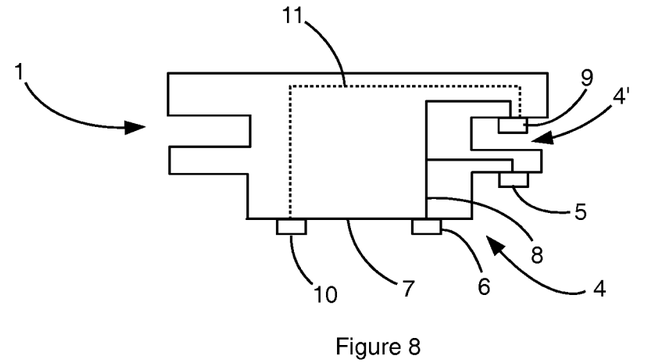
FIG. 8 illustrates in more detail another particular embodiment of a cap that can be associated with FIG. 3.

It should be noted that FIG. 4, as well as FIG. 8 described hereinbelow, show a link element 8 represented by a single line. For reasons of clarity, the layers of the stack have not been represented. Thus, it must be understood that the link element 8 is not buried but is a metal element that can comprise a part passing from side to side through at least one layer of the stack and/or a part sandwiched between two layers of the stack.

"Surface of assembly" should be understood to mean the surface 7 of the cap 1 intended to be mounted on a chipped element 2, for example by bonding or any other suitable means making it possible to assemble these two elements (cap/chipped element) together.

According to a particular implementation, the wall 3a of the shoulder 3 associated with the electrical connection terminal 5 is included in a plane P1 offset relative to a plane P2 including the surface of assembly 7. In FIGS. 4, P1 and P2 are planes that are substantially parallel, at right angles to the plane of FIG. 4 and offset along the axis A2.

According to another particular implementation, the wall 3b of the shoulder associated with the electrical connection terminal 5' is included in a plane P3 substantially at right angles to the plane P2 including the surface of assembly 7.

The two implementations described above can be combined with one another at one and the same cap, for example at different grooves, or even one and the same groove.

The separating of such connections in a cap can be implemented using metallizations produced between the electrically insulating layers in order to ensure a suitable routing between the electrical connection terminal 5 and the electrical bump contact 6 intended to be connected with a connection member of the chipped element associated with the chip of the chipped element. In other words, the stack can comprise a printed circuit of which at least one printed track, notably between two superposed electrically insulating layers, forms at least a part of the electrical link element.

Figure 5:
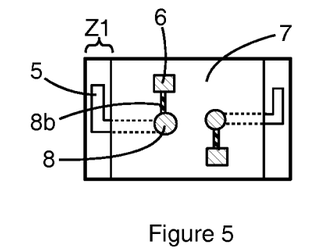
FIGS. 5, 6 and 7 illustrate different cross sections of FIG. 4.
Figure 6:
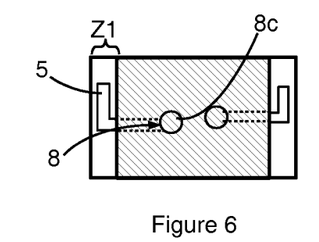
Figure 7:
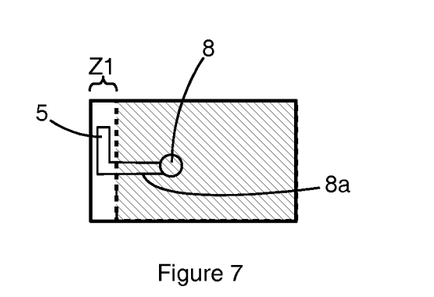

FIGS. 5, 6 and 7 respectively illustrate cross sections produced at the planes P2, P4 and P1 of FIG. 4. FIG. 5 shows the surface of assembly 7 at which the electrical bump contact 6 is formed. FIG. 6 shows the link element 8 which runs through the stack so as to separate the electrical connection terminal 5 from the (FIG. 7) at an area Z1 corresponding to a groove wall.

According to a particular embodiment, the electrical link element 8 can comprise at least one first electrically conductive element 8a inserted between two electrically insulating layers of the stack of the cap. Furthermore, the electrical link element 8 can comprise at least one second electrically conductive element 8b separated from the first electrically conductive element 8a by at least one of the electrically insulating layers of the stack. Finally, said at least one electrically insulating layer separating the first and second electrically conductive elements 8a, 8b can comprise a hole passed through by a third electrically conductive element 8c of the electrical link element 8, said third electrically conductive element 8c electrically linking the first electrically conductive element 8a to the second electrically conductive element 8b. This hole can be a metallized via such as those which are commonly used in PCB technology.

It has been specified above that the cap 1 could comprise a second groove 4', notably dissociated from the shoulder 3 of the first groove 4 and of which the walls are formed wholly or partly by faces of the cap. Consequently, as illustrated in FIG. 8, the cap 1 can comprise an additional electrical connection terminal 9 formed at one of the walls of the second groove 4'. Advantageously, the electrical link element 8 electrically links the additional electrical connection terminal 9 to said electrical bump contact 6 and/or the additional electrical connection terminal 9 is electrically linked to an additional electrical bump contact 10, positioned at the surface 7 intended to be mounted on the face of the chipped element, by an additional electrical link element 11. Thus, the connection terminals 5, 9 of the grooves 4 and 4' can be electrically linked together by one and the same link element 8 to one and the same connection member of the chipped element, or be totally dissociated.

Figure 9:
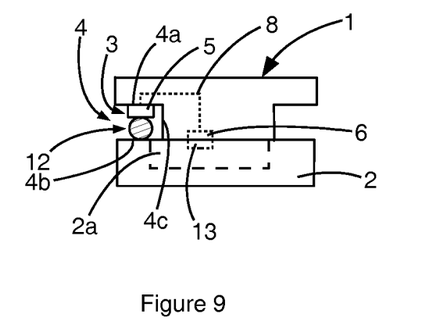
FIG. 9 illustrates a device provided with a cap and a chipped element, said device being assembled with a wired element.

It will be understood from what has been said above that the cap 1 is intended to be assembled with a chipped element 2 to form a device. As illustrated in FIG. 9, such a device comprises a chipped element 2 provided with at least one electronic chip 2a, a cap 1 as defined previously and assembled with the chipped element 2, at least one groove 4 intended to receive a wired element 12 and delimited at least partly by the shoulder 3 of the cap 1, and at least one electrical connection terminal 5 positioned in the groove 4 and electrically linked to said chip 2a of the chipped element 2.

The connection terminal 5 can be positioned at the chipped element 2, or, as in FIG. 9, at the shoulder 3. At the chipped element 2 should be understood here to mean that the connection terminal 5 extends from the chipped element, and at the shoulder should be understood here to mean that the connection terminal 5 extends from a wall delimiting said shoulder 3.

All the variants of the cap as described above can be applied to the device.

Thus, for example, as illustrated in FIG. 9, the chipped element 2 comprises at least one electrical connection member 13 of the chip 2a electrically linked to an electrical bump contact 6 associated with the cap 1 so as to electrically link the chip 2a to the electrical connection terminal 5 positioned at the shoulder 3 of the cap 1. This electrical link between the electrical connection terminal 5 and the electrical bump contact 6 can notably be implemented by the link element 8.

According to an implementation illustrated in FIG. 9, the groove 4 comprises two opposite lateral walls 4a, 4b facing one another, one of the lateral walls 4b being formed by a part of the chipped element 2 and the other lateral wall 4a being formed by a part of the shoulder 3 of the cap 1, the electrical connection terminal 5 being positioned at the lateral wall 4a associated with the cap 1. For example, the electrical connection terminal 5 can extend from the wall 4a associated with the cap 1 towards the wall 4b associated with the chipped element 2. In the example, the lateral walls 4a and 4b are linked together by a wall 4c delimiting a groove bottom 4. This wall 4c could also support the connection terminal instead of the wall 4a.

An assembly can comprise a device as described and an at least partially electrically conductive wired element 12 mounted in the groove 4. The wired element 12 is in electrical contact with the electrical connection terminal 5. Thus, the electrically conductive wired element can be electrically linked to the chip 2a of the chipped element 2.

Generally, the groove of the device comprises two lateral walls facing one another and for example linked by a bottom of the groove. A groove is advantageously open at its two opposite ends so as to allow for a longitudinal embedding of an associated wired element. The wired element 12 can be held preferentially by being pinched between the electrical connection terminal 5 borne by one of the lateral walls of the groove 4 and the other lateral wall of the groove 4. This pinching also makes it possible to ensure the electrical link between the wired element and the electrical connection terminal 5.

A groove 4 can comprise a plurality of connection terminals connected with one and the same wired element.

The wired element can serve as data bus, electrical power supply for the chipped element, or antenna for the chip.

It will be understood that the chip 2a of the chipped element 2 can thus be the data processing chip, an RFID chip, a light-emitting diode, etc.

In the context of a light-emitting diode, the cap and/or the chipped element can be transparent to the light emitted by the diode and, for example, configured in such a way as to act as lens associated with the diode.

A manufacturing method comprises a step of producing at least one cap as described in its different embodiments above.

Figure 10:
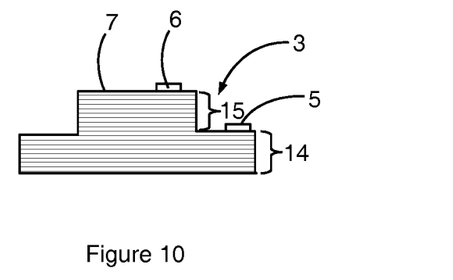
FIG. 10 illustrates a method for manufacturing a cap.

More specifically the step of producing the cap can comprise a step of forming a first part 14 of a stack of electrically insulating layers (FIG. 10), and a step of forming a second part 15 of the stack of electrically insulating layers configured in such a way as to delimit, with the first part 14 of the stack of layers, the shoulder 3 intended to at least partly delimit the first groove 4. These two forming steps can be performed in one or more steps of milling a part of the stack of layers in order to delimit the first and second parts. For example, to stop the milling, it is possible to stop upon the detection of a contact of the milling cutter with a metallization produced between two layers of the stack.

Furthermore, if appropriate, the step of producing the cap 1 comprises a step of producing at least one electrical connection terminal 5 at the shoulder 3, at least one electrical bump contact 6 at the second part 15 of the stack of layers (in particular at a surface 7 intended for the assembly of the cap with an associated chipped element), and an electrical link element (not represented) running through the second part 15 of the stack of layers, or through the first part 14 and the second part 15 of the stack of electrically insulating layers. It will be understood that this production step can be carried out during steps of forming the first part 14 and the second part 15 of the stack of layers since, at certain points, the link element can pass through one or more layers of the stack, or be sandwiched between two layers of the stack.

How to produce a cap has been described above. However, in the context of large-scale industrialization, a particular method has been able to be developed that makes it possible to produce a plurality of caps.

Figure 11:
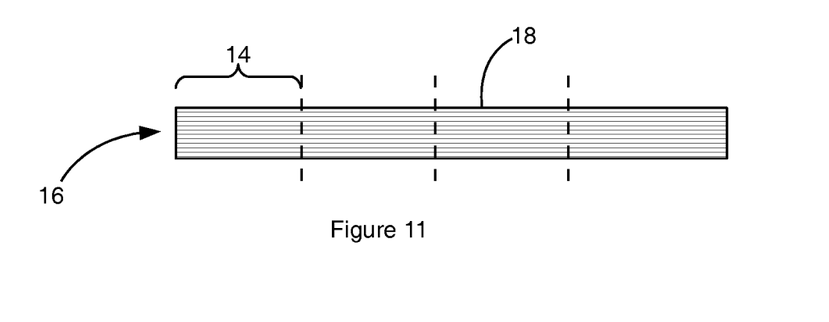
FIG. 11 illustrates a step of manufacturing a plurality of caps.
Figure 12:
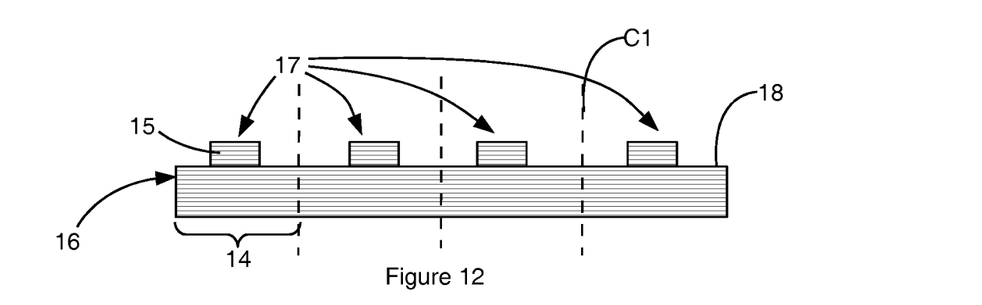
FIG. 12 illustrates another step of manufacturing a plurality of caps.
Figure 13:
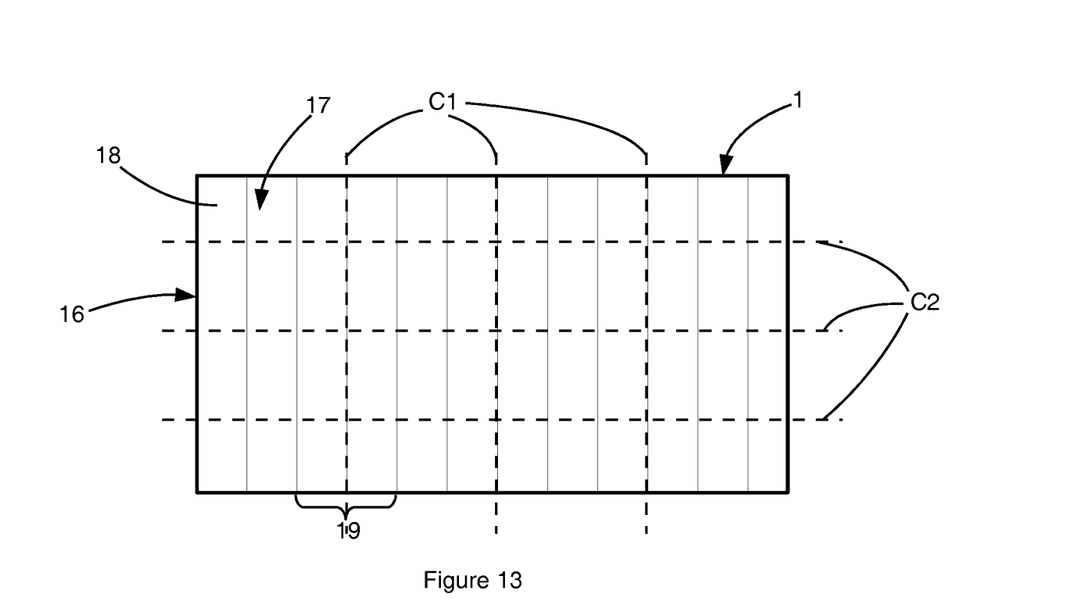
FIG. 13 illustrates FIG. 12 seen from another angle.

Thus, in the case wherein the forming step makes it possible to produce a plurality of caps, the latter comprises, as illustrated in FIGS. 11 to 13, a step of forming a first set 16 of superposed electrically insulating layers. This first set of layers 16 will be intended to form a plurality of first parts of stacks of layers 14. These different first parts 14 of stacks of layers have virtual separations indicated by dotted lines in FIGS. 11 and 12. Furthermore, the step of producing the plurality of caps comprises a step of forming a plurality of second sets 17 of superposed electrically insulating layers substantially parallel to one another and each extending from a same face 18 of the first set 16 of layers, the second sets of adjacent layers 17 being separated by a separation portion 19 of the face 18 of the first set 16 of layers bearing them. Thus, according to FIG. 12, the assembly of the first set 16 and of the second set 17 of layers has a crenulated section.

It is possible to obtain such a crenulated section using the recent PCB technologies that make it possible to produce cavities between layers. This makes it possible to obtain a succession of bands in place of a complete layer. Obviously, it is also possible, non-preferentially, to produce a single superposition of layers then to partially saw the structure obtained so as to form trenches to obtain the structure as represented in FIGS. 12 and 13 (for example the milling described above can be applied here), or even produce blind holes at certain points in order to form at least one shoulder of each future cap.

Then, the method can comprise a step of individualization of the caps 1. This step of individualization of the caps can comprise a first step of cutting the first set 16 of layers at each separation portion 19 along a first corresponding cutting line C1 and a second step of cutting the first set 16 of layers and the second set 17 of layers along at least one second cutting line C2 secant to the first cutting line C1 (preferably a plurality of second cutting lines parallel and secant to the first cutting line). The first cutting step can be performed before or after the second cutting step.

Figure 14:
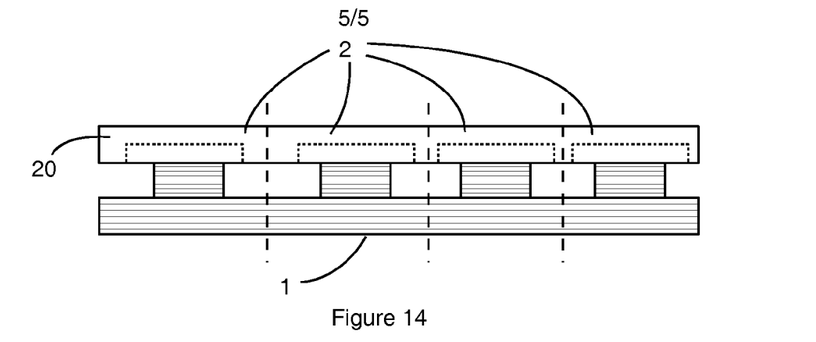
FIG. 14 illustrates another manufacturing step in which the plurality of caps is associated with chipped elements.

In order to limit the steps of assembly of a chipped element with its associated cap, before the step of individualization of the caps, the method can comprise (FIG. 14) a step of mounting a substrate 20 comprising a plurality of chipped elements 2 so as to associate the chipped elements with the future caps 1.

Preferably, the first and second cutting steps are configured in such a way as to also separate the different chipped elements from one another after the step of mounting the substrate 20.

Thus, after the first and second cutting steps, a cap is associated with a chipped element corresponding to it.

Obviously, the step of producing the plurality of caps can also comprise, for each future cap, the following steps: producing at least one electrical connection terminal at the first set 16 of layers or at the second corresponding set 17 of layers; producing at least one electrical bump contact at the first set 16 or the corresponding second set 17 of layers (notably at surfaces intended for mounting with the chipped elements); and producing at least one electrical link element running through the first set 16 of layers and/or through the corresponding second set 17 of layers, and electrically linking said electrical connection terminal and said electrical bump contact.

Figure 15:
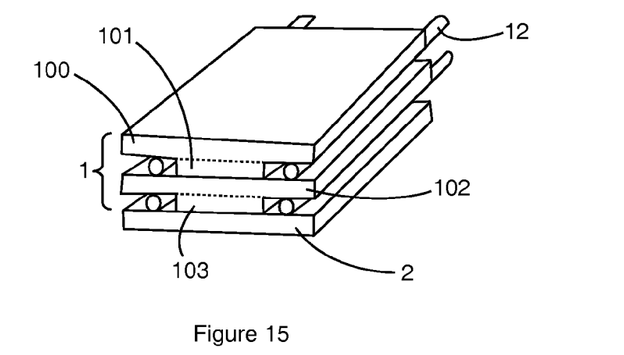
FIG. 15 shows a perspective illustration of a device with a plurality of stages making it possible to connect a plurality of wired elements in different grooves.

It should be noted that, as illustrated in FIG. 15, the cap 1 can comprise a stack formed by: a first part 100 of the stack of layers; a second part 101 of the stack of layers delimiting, with the first part 100, at least one first shoulder; a third part 102 of the stack of layers of dimensions substantially equal to the first part 100 of the stack of layers configured so as to delimit a groove with the first shoulder, a fourth part 103 of the stack of layers delimiting, with the third part 102 of the stack of layers, at least one second shoulder. The chipped element 2, preferably of the same dimensions as the first part 100 and as the third part 102, delimits, with the second shoulder, another groove. Different wired elements 12 can be associated with the duly formed different grooves.

Connection terminals of different grooves can be routed to the surface 7 of the fourth part 103 mounted on the chipped element 2 so as to connect them to connection members of the chipped element 2.

Advantageously, a connection terminal can be formed by a metallized electrically insulating protuberance or by a galvanic growth.

It will be understood from everything that has been stated above in relation to the manufacturing method that the step of producing at least one cap is such that, for each cap, it can comprise: a step of forming at least one electrical bump contact 6 arranged at a surface of assembly 7 of the stack intended to be mounted on a face of the chipped element 2; a step of forming at least one electrical connection terminal 5, 5' arranged at a wall of the shoulder 3; a step of forming an electrical link element 8 electrically linking said electrical connection terminal 5 to the electrical bump contact 6.

Obviously, it is also understood that the method can generally comprise, for each cap: a step of forming a stack of a plurality of electrically insulating layers 1a delimiting at least one shoulder 3 forming a part of a first groove 4 for housing a wired element 12. This step of forming the stack can comprise the steps of forming the first and second parts 14, 15 as described above or be the result, after the individualization of the caps, of the steps of forming the first set of layers 16 and the plurality of second sets 17 of layers as described above.

Figure 16:
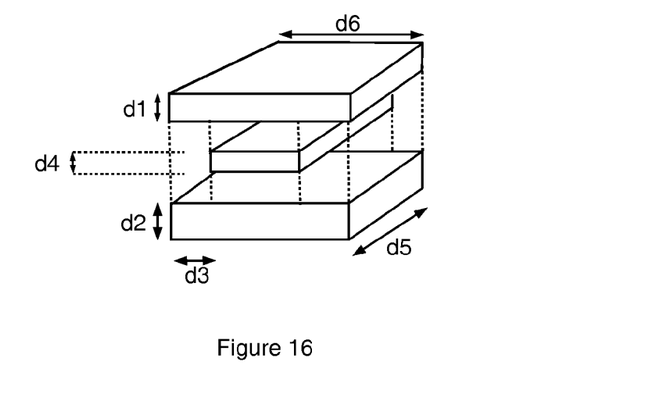
FIG. 16 illustrates an exploded view of a device provided with a cap that makes it possible to exemplify the dimensions of such a device.

FIG. 16 makes it possible to give preferred, but nonlimiting, dimensions of a device represented in an exploded view. Thus, the dimension d1 can be between 100 μm and 700 μm, the dimension d2 can be between 200 μm and 700 μm, the dimension d3 can be between 80 μm and 150 μm, the dimension d4 can be between 80 μm and 150 μm, the dimension d5 can be between 400 μm and 2000 μm, and the dimension d6 can be between 400 μm and 1000 μm.

The link element 8 can be made of copper.

The electrically insulating layers can be produced based on ceramic, electrically insulating polymer, or FR-4 (Flame-Resistant 4). FR-4 can include an epoxy polymer matrix impregnating a glass fibre reinforcement.

The present invention makes it possible to produce smart fabrics by incorporating, for example in a fabric, a device as described previously.

In the context of an electrical routing between the electrical bump contact positioned at the surface 7 and the connection terminal 5, the connection terminal 5 can be located anywhere on the cap. For example, in FIG. 8, the additional connection terminal 9 could be positioned at the lateral wall of the second groove 4' proximal to the lateral wall of the first groove 4 bearing the connection terminal 5, so making it possible, for example, to more easily link these terminals together.

The invention claimed is:

1. Cap intended to be assembled with at least one chipped element, said cap comprising:
   a stack of a plurality of electrically insulating layers delimiting at least one shoulder forming a part of a first groove, wherein the first groove is configured for housing a wired element when the cap is assembled with a chipped element,
   at least one electrical bump contact arranged at an assembly surface of the stack, wherein the assembly surface is configured to be mounted on a face of the chipped element,
   at least one electrical connection terminal arranged at a wall of the shoulder, wherein the electrical connection terminal is configured to electrically connect a wired element embedded in the groove to the chip of the chipped element,
   an electrical link element, electrically linking said electrical connection terminal to the electrical bump contact.

2. Cap according to claim 1, wherein the wall of the shoulder associated with the electrical connection terminal is included in a plane that is offset relative to a plane including the assembly surface.

3. Cap according to claim 1, wherein the electrical link element comprises at least one first electrically conductive element inserted between two electrically insulating layers of the stack.

4. Cap according to claim 3, wherein the electrical link element comprises at least one second electrically conductive element separated from the first electrically conductive element by at least one of the electrically insulating layers of the stack, and wherein said at least one electrically insulating layer separating the first and second electrically conductive elements comprises a hole that is passed through by a third electrically conductive element of the electrical link element, said third electrically conductive element electrically linking the first electrically conductive element to the second electrically conductive element.

5. Cap according to claim 1, wherein the stack comprises a printed circuit of which at least one printed track forms at least a part of the electrical link element.

6. Cap according to claim 1, wherein the shoulder co-operates with another shoulder of said cap so as to delimit the first groove.

7. Cap according to claim 1, which comprises at least one second groove, dissociated from the shoulder of the first groove, the walls of which are formed wholly or partly by faces of the cap, and which comprises at least one additional electrical connection terminal formed at one of the walls of the second groove,
   wherein at least one of (i) the electrical link element electrically links the additional electrical connection terminal to said electrical bump contact, and (ii) the additional electrical connection terminal is electrically linked to an additional electrical bump contact, positioned at the surface intended to be mounted on the face of the chipped element, by an additional electrical link element.

8. Device comprising:
a chipped element provided with at least one electronic chip,
a cap according to claim 1, assembled with the chipped element,
at least one groove intended to receive a wired element and delimited at least partly by the shoulder of the cap, and,
at least one electrical connection terminal positioned in the groove and electrically linked to said chip of the chipped element.

9. Device according to claim 8, wherein the chipped element comprises at least one electrical connection member of the chip electrically linked to an associated electrical bump contact of the cap so as to electrically link the chip to the electrical connection terminal positioned at the shoulder of the cap.

10. Assembly comprising a device according to claim 8 and an at least partially electrically conductive wired element mounted in the groove, said wired element being in electrical contact with the electrical connection terminal.

11. Manufacturing method which comprises a step of producing at least one cap according to claim 1.

12. Method according to claim 11, wherein the step of producing the cap comprises:
forming a first part of a stack of electrically insulating layers,
forming a second part of the stack of electrically insulating layers configured so as to delimit, with the first part of the stack of layers, the shoulder intended to at least partly delimit the first groove.

13. Method according to claim 12, wherein the step of producing the cap comprises producing an electrical connection terminal at the shoulder, at least one electrical bump contact at the second part of the stack of layers, and an electrical link element running through the second part of the stack of layers, or through the first part and the second part of the stack of electrically insulating layers.

14. Method according to claim 11, wherein the production step makes it possible to produce a plurality of caps, and the method comprises:
forming a first set of superposed electrically insulating layers,
forming a plurality of second sets of superposed electrically insulating layers substantially parallel to one another and each extending from a same face of the first set of layers, the second sets of adjacent layers being separated by a separation portion of the face of the first set of layers bearing them.

15. Method according to claim 14, which comprises a step of individualization of the caps.

16. Method according to claim 14, wherein the step of forming the plurality of caps comprises, for each future cap:
producing at least one electrical connection terminal at the first set of layers or at the corresponding second set of layers,
producing at least one electrical bump contact at the first set or the corresponding second set of layers,
producing at least one electrical link element running through the first set of layers and/or through the corresponding second set of layers, and electrically linking said electrical connection terminal and said electrical bump contact.

17. Cap intended to be assembled with at least one chipped element, said cap comprising:
a stack of a plurality of electrically insulating layers delimiting at least one shoulder forming a part of a first groove for housing a wired element,
at least one electrical bump contact arranged at an assembly surface of the stack intended to be mounted on a face of the chipped element,
at least one electrical connection terminal arranged at a wall of the shoulder,
an electrical link element, electrically linking said electrical connection terminal to the electrical bump contact,
wherein, the electrical link element comprises at least one first electrically conductive element inserted between two electrically insulating layers of the stack, and
wherein the electrical link element comprises at least one second electrically conductive element separated from the first electrically conductive element by at least one of the electrically insulating layers of the stack, and
wherein said at least one electrically insulating layer separating the first and second electrically conductive elements comprises a hole that is passed through by a third electrically conductive element of the electrical link element, said third electrically conductive element electrically linking the first electrically conductive element to the second electrically conductive element.

18. Cap according to claim 17, wherein the stack comprises a printed circuit of which at least one printed track forms at least a part of the electrical link element.

19. Cap intended to be assembled with at least one chipped element, said cap comprising:
a stack of a plurality of electrically insulating layers delimiting at least one shoulder forming a part of a first groove for housing a wired element,
at least one electrical bump contact arranged at an assembly surface of the stack intended to be mounted on a face of the chipped element,
at least one electrical connection terminal arranged at a wall of the shoulder,
an electrical link element, electrically linking said electrical connection terminal to the electrical bump contact,
wherein the shoulder co-operates with another shoulder of said cap so as to delimit the first groove.

20. Cap according to claim 19, wherein the stack comprises a printed circuit of which at least one printed track forms at least a part of the electrical link element.

21. Cap intended to be assembled with at least one chipped element, said cap comprising:
a stack of a plurality of electrically insulating layers delimiting at least one shoulder forming a part of a first groove for housing a wired element,
at least one electrical bump contact arranged at an assembly surface of the stack intended to be mounted on a face of the chipped element,
at least one electrical connection terminal arranged at a wall of the shoulder,
an electrical link element, electrically linking said electrical connection terminal to the electrical bump contact,
at least one second groove, dissociated from the shoulder of the first groove, the walls of which are formed wholly or partly by faces of the cap, and which comprises at least one additional electrical connection terminal formed at one of the walls of the second groove, wherein at least one of (i) the electrical link element electrically links the additional electrical connection terminal to said electrical bump contact, and (ii) the additional electrical connection terminal is electrically linked to an additional electrical bump contact, positioned at the surface intended to be mounted on the face of the chipped element, by an additional electrical link element.

22. Cap according to claim 21, wherein the stack comprises a printed circuit of which at least one printed track forms at least a part of the electrical link element.

\* \* \* \* \*